(12) United States Patent
Schmidt

(10) Patent No.: US 10,671,766 B2
(45) Date of Patent: Jun. 2, 2020

(54) EVALUATING THE STABILITY OF THREE-DIMENSIONAL MODELS

(71) Applicant: AUTODESK, Inc., San Rafael, CA (US)

(72) Inventor: Ryan Schmidt, Toronto (CA)

(73) Assignee: Autodesk, Inc., San Rafael, CA (US)

( * ) Notice: Subject to any disclaimer, the term of this patent is extended or adjusted under 35 U.S.C. 154(b) by 1211 days.

(21) Appl. No.: 14/059,168

(22) Filed: Oct. 21, 2013

(65) Prior Publication Data

US 2015/0112644 A1   Apr. 23, 2015

(51) Int. Cl.
*G06F 17/50* (2006.01)
*G06F 30/00* (2020.01)

(52) U.S. Cl.
CPC .................... *G06F 30/00* (2020.01)

(58) Field of Classification Search
CPC ........................................... G06F 17/50
USPC ............................................. 703/1
See application file for complete search history.

(56) References Cited

U.S. PATENT DOCUMENTS

| | | | | |
|---|---|---|---|---|
| 6,110,217 A * | 8/2000 | Kazmierski | ......... | G06F 17/5036 703/14 |
| 2007/0209541 A1 * | 9/2007 | Kiyohara | ............ | B41F 33/0036 101/484 |
| 2011/0149117 A1 * | 6/2011 | Vendrig | ............... | H04N 5/2226 348/239 |
| 2012/0281013 A1 * | 11/2012 | Mahdavi | ................. | G06F 17/50 345/619 |
| 2013/0124151 A1 * | 5/2013 | Mech | ...................... | G06F 17/50 703/1 |
| 2014/0016825 A1 * | 1/2014 | Kasahara | ................ | G06T 11/00 382/103 |
| 2016/0169764 A1 * | 6/2016 | Kim | ................... | G05B 19/4099 702/33 |

OTHER PUBLICATIONS

Kasahara et al. (WO2012/137463 A1) teaches an image processing apparatus, display control method and program.*
Prevost et al. (Make It Stand: Balancing Shapes for 3D Fabrication, Jul. 2013 (10 pages)).*

* cited by examiner

*Primary Examiner* — Andre Pierre Louis
(74) *Attorney, Agent, or Firm* — Artegis Law Group, LLP

(57) ABSTRACT

A three-dimensional (3D) modeling application is configured to generate a graphical user interface (GUI) that notifies a user whether a 3D model represents a stable, marginally stable, or unstable object. The 3D modeling application includes a stability module that determines the stability of the object based upon the 3D model. Advantageously, the user may ensure that an object will be stable, before printing the object with a 3D printer.

28 Claims, 7 Drawing Sheets

EVALUATING THE STABILITY OF THREE-DIMENSIONAL MODELS

BACKGROUND OF THE INVENTION

Field of the Invention

The present invention generally relates to computer graphics and, more specifically, to a tool for evaluating the stability of three-dimensional models.

Description of the Related Art

Three-dimensional (3D) modeling software allows users to compose 3D models. A given 3D model represents the surface of an object. The object could be, e.g., a representation of a human being, a toy creature, or a vehicle. Further, 3D printers are becoming more and more available to print the object from the 3D model. For instance, a user could create a 3D model of a toy creature and then print the toy creature with a 3D printer.

Unfortunately, users often create 3D models that are unstable. That is, while the 3D modeling software allows users to compose arbitrary 3D models, with a desired orientation, an object printed from a given 3D model may be unstable at the desired orientation. In general, a stable object stands up in the orientation intended by the user, but an unstable object falls over. The user does not know whether an object will be stable until the 3D printer prints the object. If an object is unstable, the user can attempt to fix the 3D model and fabricate a new object. However, the user does not know whether the new object will be stable until the 3D object is printed. This cycle of trial and error to produce a object that is stable can be frustrating, time-consuming, and costly for the user.

As the foregoing illustrates, what is needed in the art is a more effective approach for determining the stability of a 3D model.

SUMMARY OF THE INVENTION

One embodiment of the invention includes a method for indicating to a user whether a three-dimensional (3D) model represents a stable object. The method includes predicting the stability of the object printed, using a 3D printer, based on geometry of the 3D model and a set of printing parameters. The method also includes rendering an image of the 3D model and rendering a stability indicator within the image to represent the predicted stability.

One advantage of the disclosed technique is that a user can print with confidence that the object is stable. Thus, the user can print a stable object the first time, instead of iterating through multiple unstable objects before producing a stable object.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
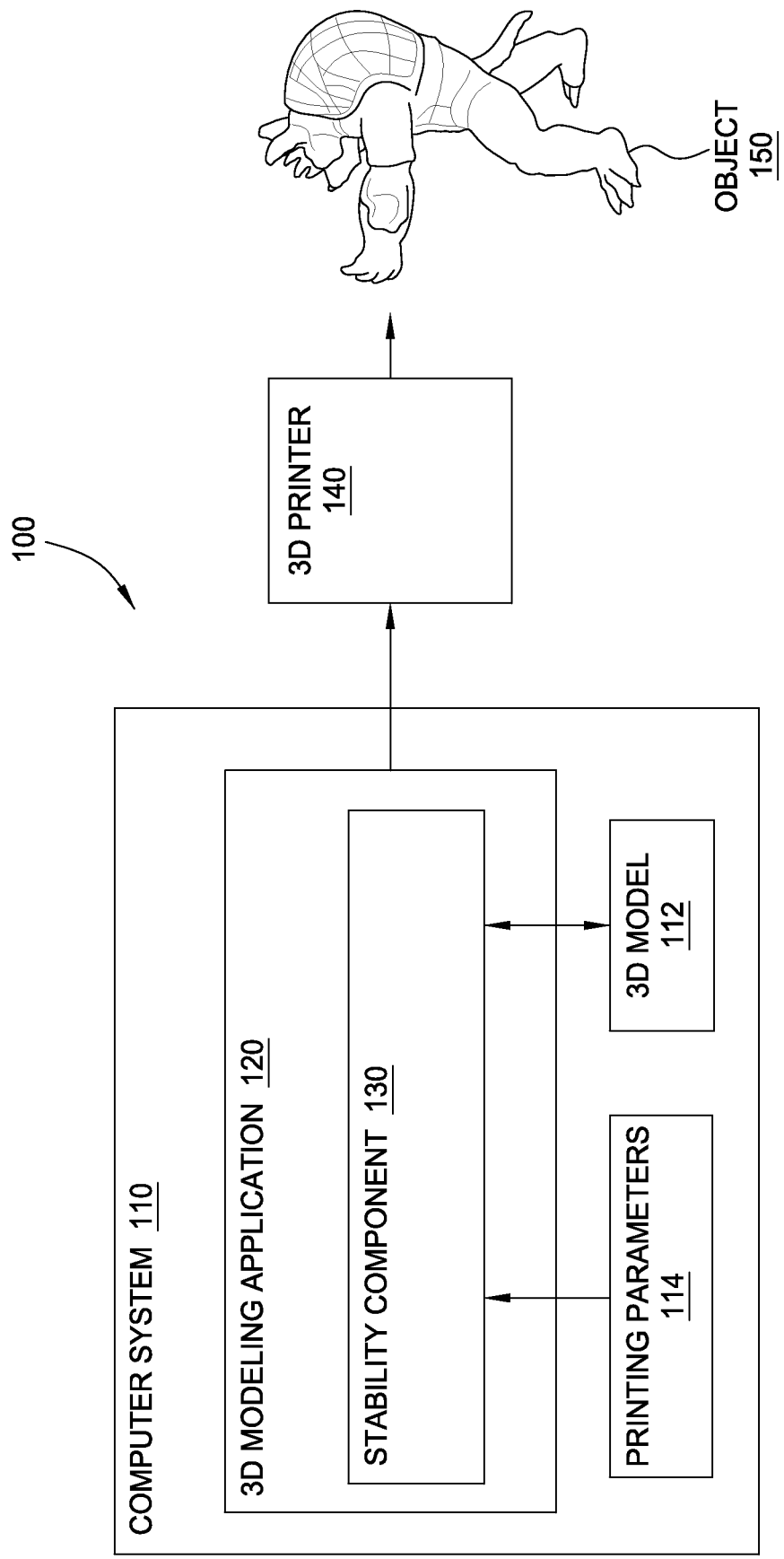
FIG. 1 is a block diagram illustrating an example 3D modeling system 100 for determining the stability of a 3D model, relative to a desired orientation, according to one embodiment.

Embodiments presented herein provide techniques for determining the stability of a physical object printed from a 3D model, as well as techniques for providing feedback to users interacting with a 3D modeling application regarding the stability of a 3D model (at a specified orientation). In one embodiment, the user composes a three-dimensional (3D) model with a 3D modeling application. The 3D model is typically defined as a polygon mesh in a 3D space, where each polygon represents a portion of the surface of the object. The user prints the object by sending the 3D model to a 3D printer. Although the 3D model may have a desired orientation, the object may not be stable at that desired orientation.

Accordingly, in one embodiment, the 3D modeling application may include a stability component configured to determine whether the 3D model is stable, at the desired orientation. That is, the stability component determines whether an object would stand in the desired orientation if printed from the 3D model. The stability component provides a reliable measure of stability by determining if a vertical projection of the center of mass (CoM) of the 3D model intersects a region at the base of the 3D model. If the projected CoM intersects the region, then the 3D model is stable. A stable 3D model represents an object that stands up in the desired orientation, when printed. If the projected CoM intersects the region within a threshold distance from the edge of the region, then the stability component determines that the 3D model is marginally stable. A marginally stable 3D model represents an object that stands up in the desired orientation, but tends to fall over easily, when printed. If the projected CoM does not intersect or is at the edge of the region, then the stability component determines that the 3D model is unstable. An unstable 3D model represents an object that does not stand up in the desired orientation, when printed.

Further, a graphical user interface (GUI) of the 3D modeling application may inform the user whether the current 3D model represents a stable, marginally stable, or unstable object. If the GUI notifies the user that the 3D model represents an unstable object, then the user can fix the 3D model. Once the stability component determines the 3D model represents a stable object, the user can print the object with confidence that the object will stand in the desired orientation.

For instance, the user could create a 3D model representing a toy creature standing on two legs. The stability component determines the stability of the toy creature based upon the 3D model. If the stability component determines that a toy creature printed from the 3D model is unstable at the desired orientation, then the stability component could display a message in the GUI warning the user. This warning allows the user to fix the 3D model and print an object that remains standing at the desired orientation.

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

FIG. 1 is a block diagram illustrating an example 3D modeling system 100 for determining the stability of a 3D model, relative to a desired orientation, according to one embodiment. As shown, the 3D modeling system 100 includes computer system 110 and a 3D printer 140 that prints the object 150. The computer system 110 includes a 3D model 112, printing parameters 114, and a 3D modeling application 120.

As discussed, the 3D model 112 includes a polygon mesh in a 3D space, where each polygon represents a portion of the surface of the object 150. Sections of the 3D model 112 with more detail include more polygons. For instance, a flat surface within the 3D model 112 may include a few polygons, but a textured surface may include hundreds of polygons. The 3D model 112 may represent a real-world object, such as, a human being, a creature, or a vehicle.

The 3D model 112 has a desired orientation that the user specifies. If stable when printed, then an object stands on a surface in the desired orientation. The 3D modeling application generally represents the surface under the object as a contact plane. The contact plane is a horizontal plane through the lowest points of the 3D model 112, where the lowest points of the 3D model 112 are the points with the lowest Y-coordinate. For instance, if a toy creature, shown as object 150, stands on a table, then the top of the table corresponds to the contact plane and the bottom of the feet of the toy creature correspond to the lowest Y-coordinate of the 3D model 112. The surface that an object stands on may be more complex, such as a series of steps with multiple different elevations, so the 3D modeling application may represent the surface with multiple contact planes.

To print an object, the user sends the 3D model 112 to the 3D printer 140. The 3D printer 140 prints an object by depositing successive layers of material, where each layer is a horizontal slice of the object. For example, the 3D printer 140 could print a cone by depositing layers of material in sequentially smaller circles on top of each other. The material may be, for example, a plastic that the 3D printer melts to deposit as layers of an object. Once deposited, the plastic cools and hardens. Persons skilled in the art will recognize the various techniques may be used to deposit and cure different materials.

The 3D printer can deposit different materials within an object. The 3D printer 140 can also deposit the materials in a variety of patterns. For instance, the 3D printer 140 can fill the interior of an object, print the interior as a lattice of material, or leave the interior empty.

The 3D printer 140 deposits a certain amount of material at a time. The amount of material that the 3D printer 140 deposits generally corresponds to a tolerance or resolution of the 3D printer 140. The 3D printer 140 may have a lower resolution than the 3D model 112. Therefore, the 3D printer 140 may print points at various Y-coordinates in the 3D model 112 within the same layer of an object.

For example, the 3D printer 140 may print an object with a certain resolution, such as layers 0.1 mm thick. However, the bottom of the 3D model 112 may include details, such as a texture. The texture may include 100s of polygons that vary in position by 0.01 mm. The texture may be lost, because the 3D printer 140 prints points in the 3D model 112 within a given distance of the contact plane as part of the bottom layer of the object.

Portions of the 3D model 112 that the 3D printer 140 prints in the bottom layer provide contact points. The horizontal distribution of these contact points affects the width of the bottom layer, which ultimately affects the stability of an object. For example, if the Y-coordinate of the lowest point of the 3D model 112 is 0.5 mm and a 3D printer prints layers of material 0.1 mm thick, then the contact points have Y-coordinates between 0.5 mm and 0.6 mm. However, if a 3D printer with a coarser resolution prints layers of material 0.2 mm thick, then there may be additional contact points with Y-coordinates between 0.6 mm and 0.7 mm. This larger set of contact points could be more widely distributed, so the bottom layer could be wider. A wider bottom layer could make an object printed with the coarser 3D printer more stable than an object printed with the 3D printer having a finer resolution.

The printing parameters 114 include the properties and settings of the 3D printer 140. To account for the effect of the resolution of the 3D printer 140 on the stability of an object, the printing parameters 114 may include a contact tolerance. The contact tolerance represents the distance between the contact plane and contact points. The user may set the contact tolerance to correspond to the resolution of the 3D printer 140. The 3D modeling application accounts for the resolution of the 3D printer 140 when determining the stability of the 3D model 112, by identifying an accurate set contact points according to the contact tolerance.

The printing parameters 114 may also specify the materials or patterns for the 3D printer 140 to use in an object. For instance, the printing parameters 114 could instruct the 3D printer 140 to print an object with a hollow interior or to fill the base of an object with a dense material. The use of various materials and patterns may affect the distribution of mass within an object and the stability of that object.

Depending on the 3D model 112 and the printing parameters 114, an object may be stable or unstable. For example, the object 150, a toy creature, could fall over if the 3D printer 140 prints the object 150 with an empty interior. However, if the user modifies the 3D model 112 to change the stance of the object 150, then the object 150 would stand up. Likewise, if the user specifies that the 3D printer 140 should fill the legs of the object 150 with a dense material, then the object 150 may be stable. For simplicity, the discussion assumes that the 3D printer 140 prints the object 150 with material of a uniform density.

To help the user generate and print an object that is stable, in one embodiment, the 3D modeling application 120 determines and notifies the user whether the 3D model 112 represents a stable object.

The 3D modeling application 120 generates, modifies, and analyzes the 3D model 112 in response to user input. The 3D modeling application 120 also renders the 3D model 112 in the GUI. The GUI may include a menu listing analyses that the 3D modeling application 120 can perform. In one embodiment, e.g. the analyses may include a stability analysis. In response to the user selecting the stability analysis, the 3D modeling application 120 renders a stability indicator. The stability indicator informs the user whether the 3D model 112 is stable at the desired orientation. With this information, a user can avoid a trial and error cycle and the user can print an object that is stable the first time.

The 3D modeling application 120 includes a stability component 130. When the user invokes the stability component 130, the stability component 130 determines whether an object is stable, marginally stable, or unstable, relative to a specified orientation, when printed from the 3D model 112. A stable object stands up in the desired orientation. An object is generally stable if a vertical projection of the CoM of the object intersects the base of support of the object. The base of support is the region of the object that contacts a surface supporting the object. A marginally stable object may stand up, but tends to fall over easily. An object with a vertical projection of the CoM that is within but close to the edge of the base of support is generally marginally stable. An unstable object does not stand up at the desired orientation. The vertical projection of the CoM of an unstable object generally lies on the edge or outside of the base of support of the object.

As part of determining the stability, the stability component 130 calculates the position of a center of mass (CoM) of the 3D model 112. The stability component 130 calculates the CoM of the 3D model 112 to represent the CoM of an object printed from the 3D model 112. For example in FIG. 1, the object 150, a toy creature, has a CoM in the center of the chest. The stability component 130 determines the CoM of the 3D model 112 as proxy for the CoM of the object 150 based upon the geometry of the 3D model 112 and the printing parameters 114. As discussed, the printing parameters 114 describe the materials and the patterns of the materials within an object. The stability component 130 models the distribution of mass from the printing parameters 114 and the geometry of the 3D model 112. The stability component 130 calculates the CoM from this distribution of mass.

For instance, if the 3D model 112 represents a toy creature with a hat, then more mass is present at the top of the toy creature than if the 3D model 112 represented a toy creature without a hat. The greater distribution of mass at the top of the toy creature raises the CoM relative to the contact plane. Likewise, if the printing parameters 114 specify that an otherwise hollow toy creature have solid feet, then the CoM would be lower than if the printing parameters 114 specified hollow feet.

As a further part of determining stability, the stability component 130 also calculates a contact polygon. The contact polygon represents the base of support of an object. For example in FIG. 1, the object 150, a toy creature, has a base of support that includes the bottom of the feet, so the contact polygon would include the bottom of the feet in the 3D model 112. The stability component 130 determines the contact polygon by finding the smallest convex polygon that includes all of the contact points. If all of the interior angles of a polygon are less than 180 degrees, then the polygon is a convex polygon.

As discussed, the contact points are the points within a given distance, represented by the contact tolerance, from the contact plane. The contact plane is the horizontal plane through the Y-coordinate of the lowest point of the 3D model 112. The contact points may have a range of Y-coordinates, so the stability component 130 determines the contact polygon from the X and Z coordinates of the contact points. The stability component 130 creates the contact polygon within the contact plane. For instance, if the stability component 130 identifies three contact points, then the contact polygon would be a triangle with a corner at each contact point. If the user increases the contact tolerance, then the size of the contact polygon may also increase to include additional contact points. Persons skilled in the art will recognize the various computations that are well-known in the art of computational geometry and suitable for calculating the contact polygon of the 3D model 112.

Once the stability component 130 calculates the CoM and contact polygon, the stability component 130 compares the CoM to the contact polygon to determine the stability of the 3D model 112. In one embodiment, the stability component 130 generates a vertical projection of the CoM onto the contact plane. This vertical projection intersects the contact plane at the X-coordinate and Z-coordinate of the CoM. For instance, if the CoM is at the XYZ coordinates (0.005, 0.349, 0.225) and the contact plane is at the Y-coordinate 0.004, then the vertical projection intersects the contact plane at the XYZ coordinates (0.005, 0.004, 0.225).

If the vertical projection is at the edge or outside the contact polygon, then the 3D model 112 is unstable, relative to the contact plane at the desired orientation. If the vertical projection is within the contact polygon, then the 3D model 112 is stable. Persons skilled in the art will recognize that many technically feasible techniques exist for determining if a point is within a polygon, such as the ray casting algorithm. Using the ray casting algorithm, the stability component 130 counts how many times a ray from the vertical projection intersects an edge of the contact polygon. If the ray intersects an odd number of edges, then the vertical projection is inside the contact polygon. Otherwise, if the ray intersects an even number of edges, then the vertical projection is outside the contact polygon.

While the 3D model 112 may be stable in an absolute sense, the 3D model 112 becomes less stable as the projection of the CoM gets closer to the edge of the contact polygon. Although, the edge of the contact polygon separates stable from unstable, the interior of the contact polygon represents a gradient, where the 3D model 112 is the most stable when the vertical projection of the CoM is at the center of the contact polygon. Likewise, the 3D model 112 is the least stable when the vertical projection of the CoM is at the edge of the contact polygon.

Because the contact polygon is a gradient, a stable 3D model 112 may be marginally stable. Accordingly, in one embodiment, if the vertical projection is within the contact polygon, but less than a threshold distance from the edge of the contact polygon, then the 3D model 112 represents a marginally stable object. The printing parameters 114 may include the threshold distance. The user may initially set the threshold distance through the GUI of the 3D modeling application 120. The stability component 130 determines the distance between the vertical projection and the nearest edge of the contact polygon. The stability component 130 then compares this calculated distance with the threshold distance. If the calculated distance is less than the threshold distance, then the 3D model 112 is marginally stable, relative to the contact plane.

After determining whether the 3D model 112 is stable, the 3D modeling application 120 renders corresponding stability indicators with the 3D model 112. If the stability component 130 determines that the 3D mode 1112 represents a stable object, then the 3D modeling application 120 renders a green sphere at the CoM of the 3D model 112. If the stability component 130 determines that the 3D model 112 represents a marginally stable object, then the 3D modeling application 120 renders a yellow sphere at the CoM of the 3D model 112. If the stability component 130 determines that the 3D model 112 represents an unstable object, then the 3D modeling application 120 renders a red sphere at the CoM of the 3D model 112. If the 3D modeling application 120 renders a red or yellow sphere at the CoM of the 3D model 112, then the user can fix the 3D model 112 before printing the object 150. The stability indicators are discussed in greater detail below in conjunction with FIGS. 4A-4C. Of course, a person skilled in the art will recognize that the red, yellow, green sphere is an example of a useful stability indicator and any number of different indicators could be implemented to indicate the stability of the 3D model 112.

While described as being invoked in response to user input, in alternate embodiments, the stability analysis may operate dynamically while the user interacts with the 3D model 112. For example, the 3D modeling application 120 may automatically invoke the stability analysis when the user edits the 3D model 112. This dynamic stability analysis allows the user to optimize an aesthetic effect of the 3D model 112 while maintaining reliable stability.

In other embodiments, the stability component 130 may perform physics based analysis of the 3D model 112 to determine the effects of small forces on the stability of the 3D model 112. Further, in yet other embodiments, the 3D modeling application 120 may allow the user to select contact planes at various locations within the 3D model 112. For example, if the user designs an object to stand on two steps of a staircase, then the user could select different contact planes for each step.

Figure 2:
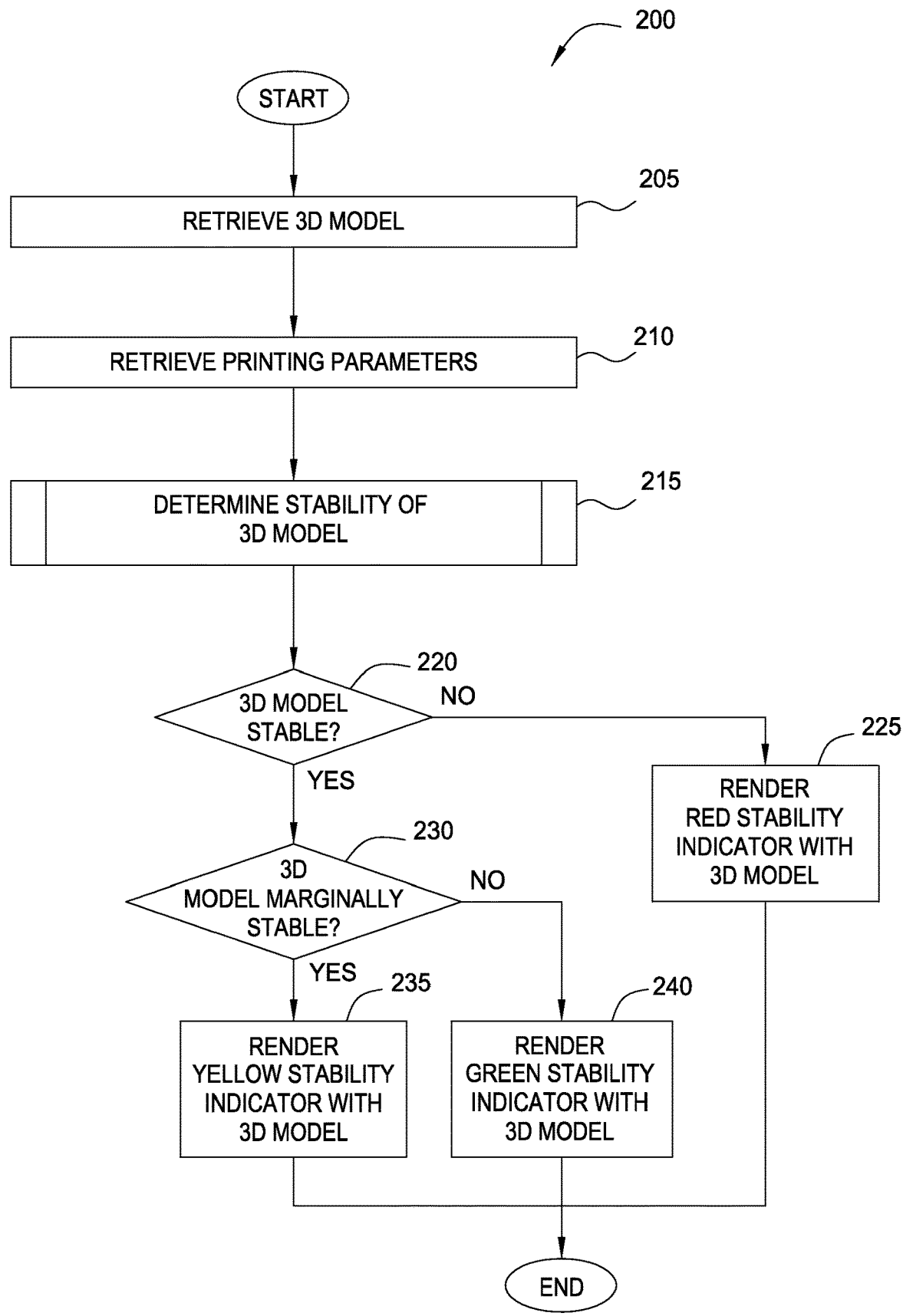
FIG. 2 illustrates a method for displaying a determined stability of an object, according to one embodiment.

FIG. 2 illustrates a method for displaying a determined stability of an object, according to one embodiment. Although the method steps are described in conjunction with the system of FIG. 1, persons skilled in the art will understand that any system configured to perform the method steps, in any order, is within the scope of the present invention.

As shown, method 200 begins at step 205, where the 3D modeling application 120 retrieves 3D model 112. As discussed the 3D model 112 has a desired orientation. The 3D modeling application 120 may render an image of the 3D model 112. The 3D modeling application 120 may also determine the stability of the 3D model 112, relative to the desired orientation.

At step 210, the 3D modeling application 120 retrieves a set of printing parameters 114. For example, the 3D modeling application 120 may retrieve printing parameters 114 for the contact tolerance. The contact tolerance represents the distance between the contact plane and the contact points. The contact tolerance allows the stability module 130 to identify contact points above the contact plane of the 3D model 112. The 3D modeling application 120 may also retrieve parameters that specify the materials or patterns for the 3D printer 140 to use when printing an object. These printing parameters 114 may specify different materials to use in different portions of an object. The printing parameters 114 may also specify patterns for the 3D printer 140 to use. For instance, the printing parameters 114 may specify that the 3D printer 140 fills the base of an object with material, but leaves the top of the object hollow when printing the object.

Figure 3:
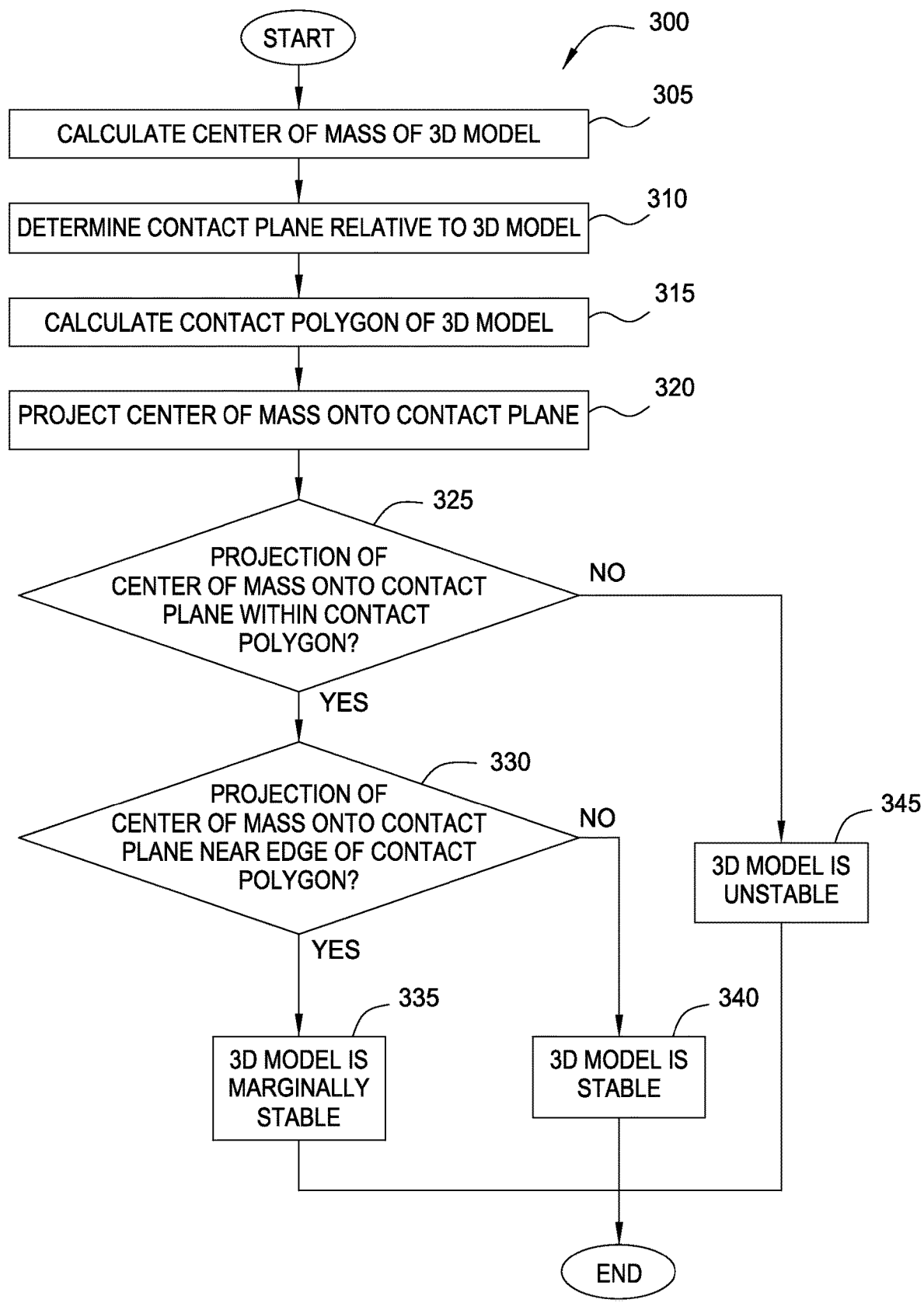
FIG. 3 illustrates a method for determining the stability of a 3D model, according to one embodiment.

At step 215, the 3D modeling application 120 invokes the stability component 130 to determine the stability of 3D model 112 relative to the desired orientation. The 3D modeling application 120 provides the 3D model 112 and the printing parameters 114 to the stability component 130. As noted, the stability component determines whether the 3D model 112 represents a stable, marginally stable, or unstable object. Once determined, the stability component 130 reports the stability to the 3D modeling application 120. FIG. 3 describes step 215 in greater detail.

At step 220, the 3D modeling application 120 determines if the 3D model 112 is stable. If the stability component 130 reports that the 3D model 112 is stable at step 215, then at step 230, the 3D modeling application 120 determines if the 3D model 112 is marginally stable. If the stability component 130 reports that the 3D model 112 is marginally stable at step 215, then at step 235, the 3D modeling application 120 renders a yellow stability indicator at the CoM of the 3D model 112. In response to this warning, the user can edit the 3D model 112.

If the 3D model 112 is more than marginally stable, then at step 240, the 3D modeling application 120 renders a green stability indicator at the CoM of the 3D model 112.

If the stability component 130 reports that the 3D model 112 represents an unstable object at step 215, then at step 225, the 3D modeling application 120 renders a red stability indicator at the CoM of the 3D model 112. In response to this warning, the user can correct the 3D model 112.

FIG. 3 illustrates a method for determining the stability of a 3D model, according to one embodiment. Although the method steps are described in conjunction with the systems of FIG. 1, persons skilled in the art will understand that any system configured to perform the method steps, in any order, is within the scope of the present invention.

As shown, method 300 begins at step 305, where the stability component 130 determines a CoM of the 3D model 112. The stability component 130 determines the CoM from the geometry of the 3D model 112 and a distribution of mass within that geometry. As discussed, the printing parameters 114 may include information about the distribution and/or density of the material within the object. The stability component 130 models the distribution of mass within the geometry of the 3D model 112. The stability component 130 calculates the CoM from this distribution of mass.

At step 310, the stability component 130 determines a contact plane relative to the 3D model 112. As discussed, the contact plane represents a surface to place an object on, when printed. For instance, the contact plane of a toy creature with two feet would be at the bottom of the feet. The contact plane is the horizontal plane through the Y-coordinate of the lowest points of the 3D model 112. The stability component 130 identifies the contact plane by determining Y-coordinate of the lowest points within the 3D model 112.

At step 315, the stability component 130 calculates the contact polygon of the 3D model 112. The stability component 130 calculates the contact polygon based upon the contact points of the 3D model 112. The stability component 130 identifies the contact points as the set of points with Y-coordinates less than a given distance, represented by the contact tolerance, from the contact plane. As discussed, the user sets the contact tolerance to represent the resolution of a given 3D printer. If the user increases the contact tolerance, then the stability component 130 may identify more contact points.

The stability component 130 determines the contact polygon by finding the convex polygon of the contact points. The stability component 130 creates the contact polygon within the contact plane. As discussed the size of the contact polygon depends on the distribution of the contact points that the stability component 130 identifies with a given contact tolerance.

At step 320, the stability component 130 projects the CoM determined at step 305 onto the contact plane. The stability component 130 creates a vertical projection from the CoM. This vertical projection intersects the contact plane at the X-coordinate and Z-coordinate of the CoM.

At step 325, the stability component 130 determines if the vertical projection is within the contact polygon. The stability component 130 may implement a ray casting algorithm to determine whether vertical projection is within the polygon. If the ray intersects an odd number of edges, then the vertical projection is inside the contact polygon. Otherwise, if the ray intersects an even number of edges, then the vertical projection is outside the contact polygon.

If the vertical projection is at the edge or outside the contact plane, then at step 345, the stability component 130 reports that the 3D model 112 represents an object that is unstable. If the user prints the object, then the object would not stand up as intended.

If the vertical projection is within the contact polygon, then at step 330, the stability component 130 determines if the vertical projection is less than a threshold distance from the edge of the contact polygon. The stability component retrieves the threshold distance from the printing parameters 114. The stability component 130 calculates the distance between the vertical projection and the closest edge of the contact polygon. The stability component 130 then compares this calculated distance with the threshold distance.

If this calculated distance is less than the threshold distance, then at step 335, the stability component 130 reports that the 3D model 112 represents an object that is marginally stable. While stable if printed, the object tends to fall over easily.

If the stability component 130 determines that the vertical projection is more than the threshold distance inside the contact polygon (step 330), then at step 340, the stability component 130 reports that the 3D model 112 represents an object that is stable. If printed, the object would reliably stand up as intended.

Figure 4A:
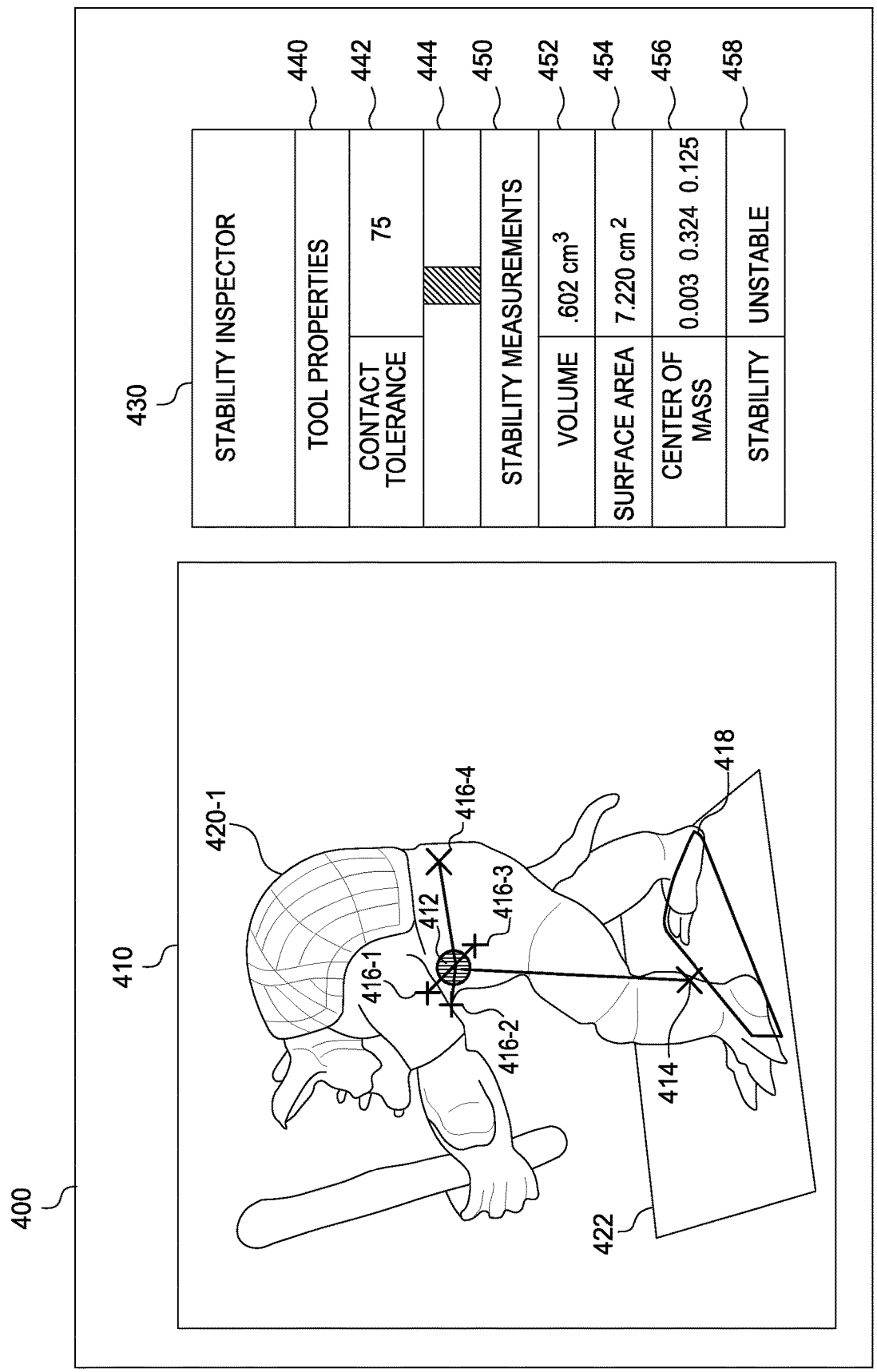
FIG. 4A illustrates a screenshot of a GUI configured to indicate the stability of a 3D model, according to one embodiment of the present invention.

FIG. 4A illustrates a screenshot of a GUI 400 configured to indicate the stability of a 3D model, according to one embodiment of the present invention. The 3D modeling application 120 is configured to generate GUI 400. The 3D modeling application 120 is also configured to implement the various functionalities associated with the GUI 400 and each GUI element.

As shown, GUI 400 includes a viewport 410 and a control panel 430. The viewport 410 illustrates a 3D model 420-1. As also shown, the 3D model 420-1 represents a toy creature holding a club. The 3D modeling application 120 displays the 3D model 420-1 with a contact plane 422, a contact polygon 418, and a stability indicator 412.

The 3D modeling application 120 renders the contact plane 422 at the lowest Y-coordinate of the 3D model 420-1. The 3D modeling application 120 also renders the contact polygon 418 within the contact plane 422. As discussed the stability module 130 uses the contact plane 422 to determine the contact points and the contact polygon 418 represents the smallest convex polygon that includes all the contact points.

The 3D modeling application 120 renders the stability indicator 412 at the CoM of the 3D model 420-1. The color of the stability indicator 412 indicates the stability of the 3D model 420-1. In the example of FIG. 4A, the 3D model 420-1 is unstable, so the 3D modeling application 120 renders a red stability indicator 412 (represented using vertical lines). If the 3D model 420-1 were stable or marginally stable, the 3D modeling application 120 would render a different colored stability indicator 412, as discussed in conjunction with FIGS. 4B and 4C.

In addition, the 3D modeling application 120 renders a position of the CoM relative to the 3D model 420-1. The 3D modeling application 120 renders horizontal projections 416-1, 416-2, 416-3, and 416-4 from the CoM on the surface of the 3D model 420-1. These horizontal projections 416-1, 416-2, 416-3, and 416-4 indicate the Y-coordinate, or height, of the CoM. The 3D modeling application 120 also renders the vertical projection 414 from the CoM onto the contact plane 422. The vertical projection 414 indicates the X and Z coordinates of the CoM relative to the contact plane 422 and contact polygon 418.

As discussed relative to method 300, the stability component 130 determines the stability of the 3D model 420-1 by comparing the vertical projection 414 to the contact polygon 418. The 3D modeling application 120 renders the vertical projection 414 outside the contact polygon 418 for the 3D model 420-1. The position of the vertical projection 414 relative to the contact polygon 418 is another indication that the 3D model 420-1 cannot be printed as a stable object.

The control panel 430 includes a tool properties section 440 and a stability measurements section 450. The tool properties section 440 allows the user to control the stability module 130. The tool properties section 440 includes a contact tolerance slider 444 and a contact tolerance readout 442. The contact tolerance slider 444 allows the user to control the value of the contact tolerance. The contact tolerance readout 442 displays the current value of the contact tolerance.

As discussed, the size of the bottom layer of an object may depend on the tolerance or resolution of a given 3D printer and may ultimately affect the stability of the object, when printed. A 3D printer with a coarser resolution prints thicker layers of material, than a 3D printer with a finer resolution. A thicker layer of material at the base of the object includes more contact points than a thin layer. The additional contact points may be distributed further apart from each other, so the bottom layer may be wider. The wider bottom layer may make the object more stable. The stability module 130 uses the contact tolerance to determine the contact points and then the contact polygon of the 3D model 420-3. The user can improve the accuracy of the stability module 130 by manipulating the value of the contact tolerance to represent the resolution of a given 3D printer 140.

In FIG. 4A, the contact tolerance slider 444 is represented by a slider element, although persons skilled in the art will recognize that any reasonable GUI element could be implements to control the contact tolerance parameter. In different embodiments, the stability module 130 may rely upon a wide variety of different printing parameters 114, so a person skilled in the art will also recognize that any number of GUI elements could be implemented to control the stability module 130.

As shown, the stability measurements section 450 displays a volume readout 452, a surface area readout 454, a CoM coordinates readout 456, and a stability readout 458. The volume readout 452 displays the volume of the 3D model 420-1. In the example of FIG. 4A, volume readout 452 displays the volume of the 3D model 420-1 as 0.602 cubic centimeters. The surface area readout 454 displays the surface area of the 3D model 420-1. In the example of FIG. 4A, the surface area readout 454 displays the surface area of the 3D model 420-1 as 7.220 square centimeters. The CoM coordinates readout 456 displays the XYZ coordinates of the CoM of the 3D model 420-1. In the example of FIG. 4A, the CoM coordinates readout 456 displays the XYZ coordinates as (0.003, 0.324, 0.125). The stability readout 458 displays a text description of the stability of the 3D model 420-1. For example, the text description may provide a value of "Stable," "Marginally stable," or "Unstable." In this example, the 3D model 420-1 is unstable, so the stability readout 458 displays "Unstable."

In operation, the GUI 400 allows the user to check if the 3D model 420-1 represents a stable object before printing. If the user finds that the 3D model 420-1 does not represent a stable object, as shown, then the user may revise the 3D model 420-1. For example, the user revises 3D model 420-1 until the CoM is above the contact polygon 418.

Figure 4B:
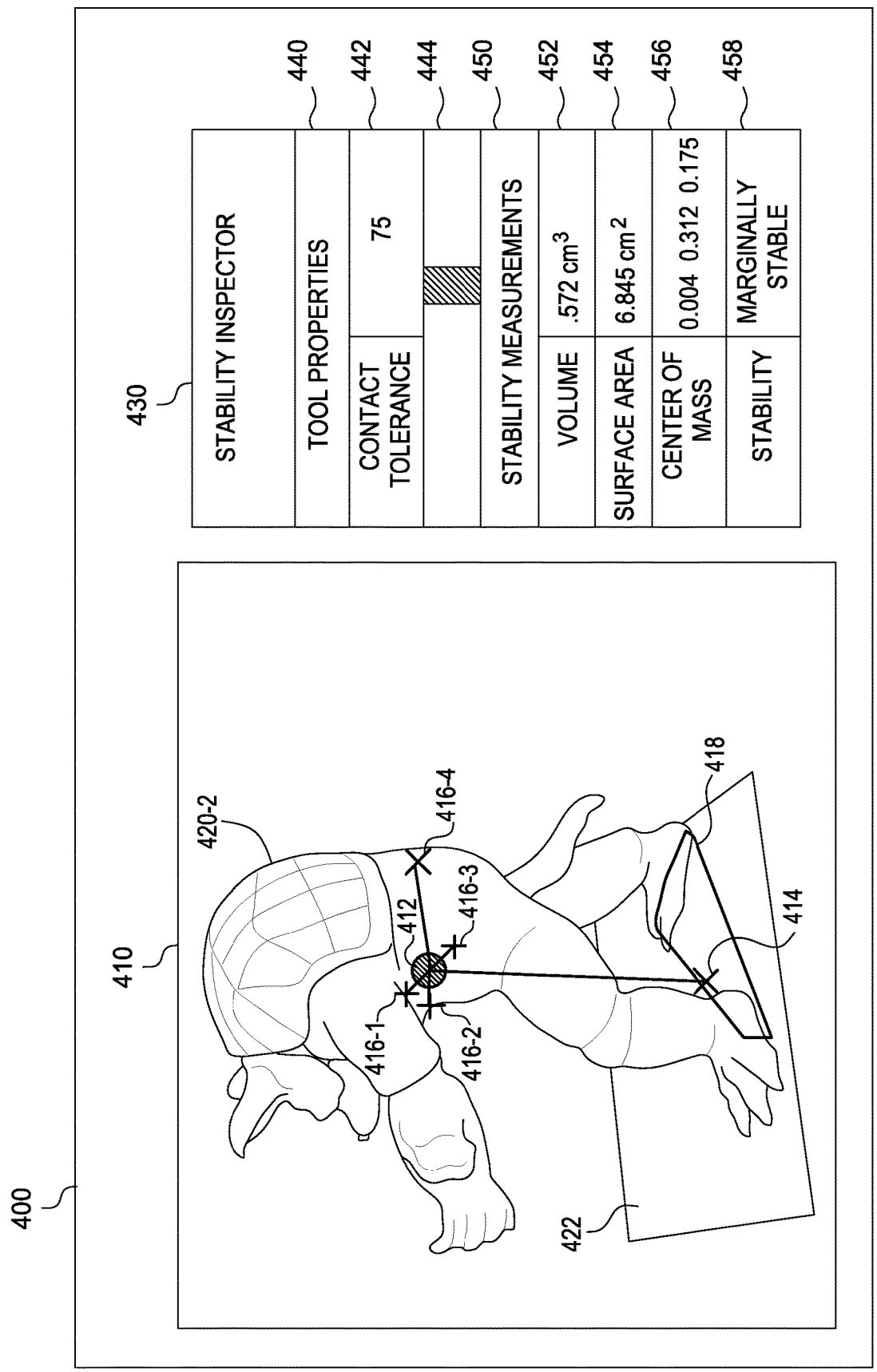
FIG. 4B illustrates a screenshot of a GUI, according to another embodiment of the present invention.

FIG. 4B illustrates a screenshot of the GUI 400, according to another embodiment of the present invention. As shown, the user has removed the club from the 3D model 420-2.

Removing the club changes the location of the CoM and, ultimately, the stability of the 3D model 420-2. Without the mass of the club toward the front of the 3D model 420-2, the CoM of the 3D model 420-2 shifts backward. The corresponding vertical projection 414 also shifts backward. After removing the club, the vertical projection 414 is within the contact polygon 418, but at the edge of the contact polygon 418. The stability component 130 determines that the 3D model 420-2 represents a marginally stable object.

Illustratively, the 3D modeling application 120 renders the 3D model 420-2 in the viewport 410. The 3D modeling application 120 also renders the stability indicator 412, the horizontal projections 416-1, 416-2, 416-3, and 416-4, and the vertical projection 414 at new locations within the viewport 410. As discussed, the 3D modeling application 120 renders the stability indicator 412 at the CoM, so the new locations of the stability indicator 412 and various projections reflect the change in position of the CoM. In the example of FIG. 4B, the 3D model 420-2 is marginally stable, so the 3D modeling application 120 renders a yellow stability indicator 412 (represented using diagonal lines).

The 3D modeling application 120 also updates the stability measurements section 450. In the example of FIG. 4B, the CoM coordinates readout 456 displays the XYZ coordinates (0.004, 0.312, 0.175), the volume readout 452 displays the volume of 0.572 cubic centimeters, and the surface area readout 454 displays the surface area of 6.845 square centimeters. The stability readout 458 displays the text description "Marginally stable."

After removing the club, 3D model 420-2 has marginal stability, so if printed, the resulting object could stand up but would likely be prone to tipping over. Therefore, the user stabilizes the 3D model 420-2 further by continuing to modify the 3D model 420-1 until the vertical projection 414 is closer to the center of the contact polygon 418.

Figure 4C:
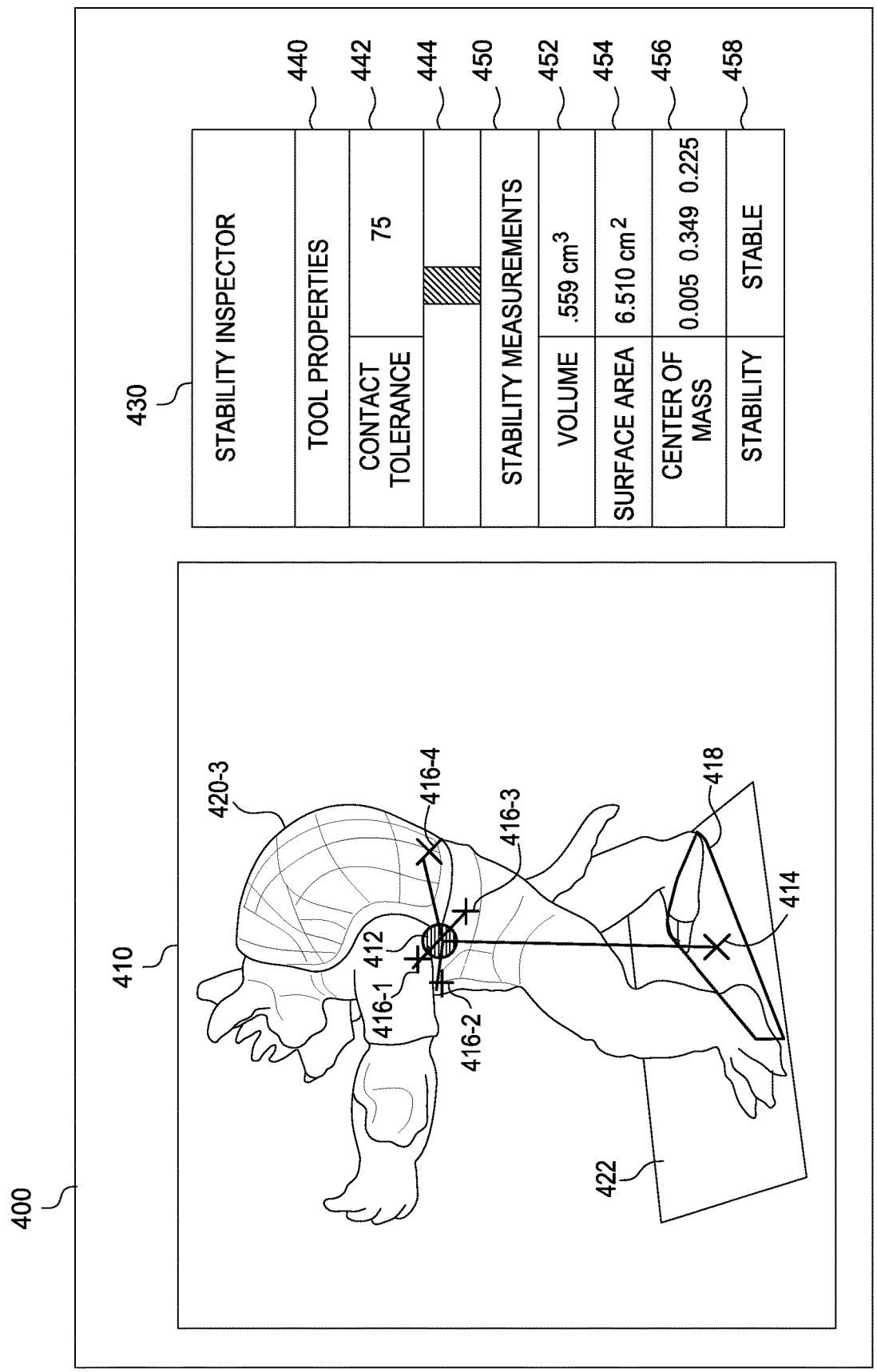
FIG. 4C illustrates a screenshot of a GUI, according to yet another embodiment of the present invention.

FIG. 4C illustrates a screenshot of the GUI 400, according to yet another embodiment of the present invention. As shown, the user has shifted the top half of the 3D model 430-3 backward.

Shifting the top half of the 3D model 430-3 changes the location of the CoM and, ultimately, the stability of the 3D model 420-3. The vertical projection 414 is closer to the center of the contact polygon 418. The stability component 130 determines that the 3D model 420-3 represents a stable object.

As discussed, in one embodiment the 3D modeling application 120 may dynamically invoke the stability analysis, which allows the user to maintain reliable stability while altering the 3D model 430-3. For example, the user could shift the top half of the 3D model 430-3 slightly forwards or backwards until the user achieves the desired aesthetic effect. While making these updates, the 3D modeling application 120 continually informs the user of the stability of the 3D model 430-3. Based on this continual feedback, the user can maintain reliable stability.

As shown, the 3D modeling application 120 renders the 3D model 420-3 in the viewport 410. The 3D modeling application 120 also renders the stability indicator 412, the horizontal projections 416-1, 416-2, 416-3, and 416-4, and the vertical projection 414 at new locations within the viewport 410. In the example of FIG. 4C, the 3D model 420-3 is stable, so the 3D modeling application 120 renders a green stability indicator 412 (represented using horizontal lines).

The 3D modeling application 120 also updates the stability measurements section 450. In the example of FIG. 4C, the CoM coordinates readout 456 displays the XYZ coordinates (0.005, 0.349, 0.225), the volume readout 452 displays the volume of 0.559 cubic centimeters, and the surface area readout 454 displays the surface area of 6.510 square centimeters. The stability readout 458 displays the text description "Stable."

When the user sees the green stability indicator 412, the vertical projection 414 inside the contact polygon 418, and/or the stability readout 458, the user understands that the 3D model 420-3 represents a stable object. The user could then print the object with confidence that the object will be stable and will not fall over. Thus, the stability module 130 allows the user to print an object that is stable the first time.

Figure 5:
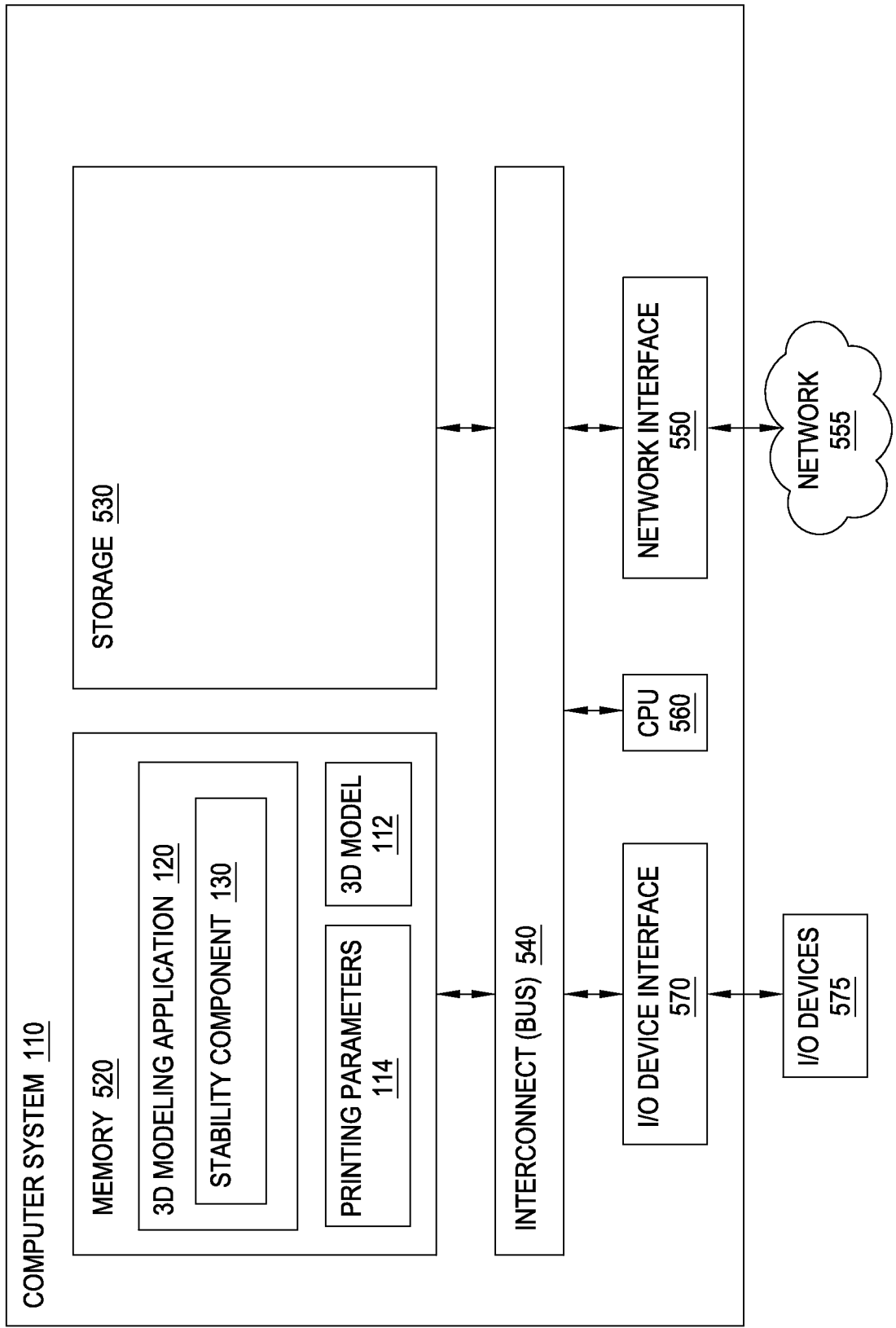
FIG. 5 illustrates a computing device configured to implement one or more aspects of the present invention.

FIG. 5 illustrates a computing system 110 configured to implement one or more aspects of the present invention. As shown, the computing system 110 includes, without limitation, a central processing unit (CPU) 560, a network interface 550 coupled to a network 555, a memory 520, and storage 530, each connected to a bus 540. The computing system 110 may also include an I/O device interface 570 connecting I/O devices 575 (e.g., keyboard, display, mouse, three-dimensional (3D) scanner, and/or touchscreen) to the computing system 110. Further, in context of this disclosure, the computing elements shown in computing system 110 may correspond to a physical computing system (e.g., a system in a data center) or may be a virtual computing instance executing within a computing cloud.

The CPU 560 retrieves and executes programming instructions stored in the memory 520 as well as stores and retrieves application data residing in the storage 530. The interconnect 540 is used to transmit programming instructions and application data between the CPU 560, I/O devices interface 570, storage 530, network interface 550, and memory 520. Note, CPU 560 is included to be representative of a single CPU, multiple CPUs, a single CPU having multiple processing cores, and the like. And the memory 520 is generally included to be representative of a random access memory. The storage 530 may be a disk drive storage device. Although shown as a single unit, the storage 530 may be a combination of fixed and/or removable storage devices, such as fixed disc drives, removable memory cards, or optical storage, network attached storage (NAS), or a storage area-network (SAN).

Illustratively, the memory 520 includes the 3D model 112, the printing parameters 114, and the 3D modeling application 120. As discussed, the 3D model 112 is a mathematical model of an object, and may include a polygonal mesh, a point cloud, a wireframe model, or a manifold, among other types of mathematical models. The printing parameters 114 include a list of parameters associated with the stability of the object, when printed. The 3D modeling application 120 is a software application configured to generate and/or modify the 3D model 112. The 3D modeling application 120 includes the stability module 130. The stability module 130 determines whether the 3D model 112 represents a stable object. The 3D modeling application 120 is also configured to generate the 3D modeling and stability GUI 400 for a display device included within I/O devices 575. The 3D modeling and stability GUI 400 indicates the stability of the 3D model 112, as determined by the stability module 130.

One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

The invention has been described above with reference to specific embodiments. Persons skilled in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

The invention claimed is:

1. A computer-implemented method for indicating whether a three-dimensional (3D) model represents a stable object, the method comprising:
    predicting a stability of an object printed, using a 3D printer, based on a geometry of the 3D model and at least one of a printer property and a printer setting associated with the 3D printer;
    rendering an image of the 3D model;
    rendering a stability indicator in the image to represent the predicted stability;
    receiving a modification to the at least one of the printer property and the printer setting; and
    in response to receiving the modification:
        updating the predicted stability of the object based on the modification; and
        rendering an updated stability indicator in accordance with the updated predicted stability.

2. The computer-implemented method of claim 1, wherein determining the stability of the 3D model includes evaluating a position of a first projection of a center of mass (CoM) of the 3D model into a contact plane, relative to a contact polygon.

3. The computer-implemented method of claim 2, wherein the contact plane is a horizontal plane intersecting a lowest point of the 3D model.

4. The computer-implemented method of claim 2, wherein the contact polygon is a convex polygon calculated from points in the 3D model within a specified distance from the contact plane.

5. The computer-implemented method of claim 2, further comprising:
    determining that the 3D model is stable in response to the position of the projection of the CoM being inside the contact polygon.

6. The computer-implemented method of claim 2, further comprising:
    determining that the 3D model is marginally stable in response to the position of the projection of the CoM being inside the contact polygon by less than a threshold distance from a nearest edge of the contact polygon.

7. The computer-implemented method of claim 2, further comprising:
    determining that the 3D model is unstable in response to the position of the projection of the CoM being on an edge of the contact polygon or outside of the contact polygon.

8. The computer-implemented method of claim 1, wherein the stability of the object is predicted relative to a plurality of contact planes at different elevations relative to the 3D model.

9. The computer-implemented method of claim 1, wherein the predicted stability is updated and the updated stability indicator is rendered dynamically in response to receiving the modification.

10. The computer-implemented method of claim 1, wherein determining the stability of the 3D model includes evaluating a position of a first projection of a center of mass (CoM) of the 3D model into a contact plane intersecting a lowest point of the 3D model, relative to a contact polygon calculated from points in the 3D model within a specified distance from the contact plane, and wherein the updated stability indicator indicates the stability of the object prior to printing the object with the 3D printer.

11. The computer-implemented method of claim 1, wherein the at least one of the printer property and the printer setting is associated with a resolution of the 3D printer.

12. The computer-implemented method of claim 1, wherein the at least one of the printer property and the printer setting comprises a contact tolerance.

13. The computer-implemented method of claim 1, wherein the at least one of the printer property and the printer setting specifies a material for the 3D printer to employ when printing the object.

14. The computer-implemented method of claim 1, wherein the at least one of the printer property and the printer setting specifies a pattern for the 3D printer to employ when printing the object.

15. A non-transitory computer-readable storage medium storing instructions that, when executed by a processor, cause the processor to perform an operation for indicating whether a three-dimensional (3D) model represents a stable object, the operation comprising:
    predicting a stability of an object printed, using a 3D printer, based on a geometry of the 3D model and at least one of a printer property and a printer setting associated with the 3D printer;
    rendering an image of the 3D model;
    rendering a stability indicator in the image to represent the predicted stability;
    receiving a modification to the at least one of the printer property and the printer setting; and
    in response to receiving the modification:
        updating the predicted stability of the object based on the modification; and
        rendering an updated stability indicator in accordance with the updated predicted stability.

16. The non-transitory computer readable storage medium of claim 15, wherein determining the stability of the 3D model includes evaluating a position of a first projection of a center of mass (CoM) of the 3D model into a contact plane intersecting a lowest point of the 3D model, relative to a contact polygon calculated from points in the 3D model within a specified distance from the contact plane.

17. The non-transitory computer readable storage medium of claim 16, wherein the operation further comprises:
    determining that the 3D model is stable in response to the position of the projection of the CoM being inside the contact polygon.

18. The non-transitory computer readable storage medium of claim 16, wherein the operation further comprises:
  determining that the 3D model is marginally stable in response to the position of the projection of the CoM being inside the contact polygon by less than a threshold distance from a nearest edge of the contact polygon.

19. The non-transitory computer readable storage medium of claim 16, wherein the operation further comprises:
  determining that the 3D model is unstable in response to the position of the projection of the CoM being on an edge of the contact polygon or outside of the contact polygon.

20. The non-transitory computer readable storage medium of claim 15, wherein the stability of the object is predicted relative to a plurality of contact planes at different elevations relative to the 3D model.

21. The non-transitory computer readable storage medium of claim 15, wherein the predicted stability is updated and the updated stability indicator is rendered dynamically in response to receiving the modification.

22. A computer system, comprising:
  a memory; and
  a processor storing one or more programs configured to perform an operation for indicating whether a three-dimensional (3D) model represents a stable object, the operation comprising:
  predicting a stability of an object printed, using a 3D printer, based on a geometry of the 3D model and at least one of a printer property and a printer setting associated with the 3D printer;
  rendering an image of the 3D model;
  rendering a stability indicator in the image to represent the predicted stability;
  receiving a modification to the at least one of the printer property and the printer setting; and
  in response to receiving the modification:
    updating the predicted stability of the object based on the modification; and
    rendering an updated stability indicator in accordance with the updated predicted stability.

23. The system of claim 22, wherein determining the stability of the 3D model includes evaluating a position of a first projection of a center of mass (CoM) of the 3D model into a contact plane intersecting a lowest point of the 3D model, relative to a contact polygon calculated from points in the 3D model within a specified distance from the contact plane.

24. The system of claim 23, wherein the operation further comprises:
  determining that the 3D model is stable in response to the position of the projection of the CoM being inside the contact polygon.

25. The system of claim 23, wherein the operation further comprises:
  determining that the 3D model is marginally stable in response to the position of the projection of the CoM being inside the contact polygon by less than a threshold distance from a nearest edge of the contact polygon.

26. The system of claim 23, wherein the operation further comprises:
  determining that the 3D model is unstable in response to the position of the projection of the CoM being on an edge of the contact polygon or outside of the contact polygon.

27. The system of claim 22, wherein the predicted stability is updated and the updated stability indicator is rendered dynamically in response to receiving the modification.

28. The system of claim 22, wherein the stability of the object is predicted relative to a plurality of contact planes at different elevations relative to the 3D model.

* * * * *